United States Patent [19]
Altoz

[11] Patent Number: 4,851,856
[45] Date of Patent: Jul. 25, 1989

[54] FLEXIBLE DIAPHRAGM COOLING DEVICE FOR MICROWAVE ANTENNAS

[75] Inventor: Frank E. Altoz, Catonsville, Md.

[73] Assignee: Westinghouse Electric Corp., Pittsburgh, Pa.

[21] Appl. No.: 156,042

[22] Filed: Feb. 16, 1988

[51] Int. Cl.$^4$ .......................... H01Q 1/00; H05K 7/20

[52] U.S. Cl. ..................................... 343/720; 361/382; 361/385; 165/46

[58] Field of Search ................ 343/720; 361/381, 382, 361/385, 386; 165/46, 48.1, 56

[56] References Cited

U.S. PATENT DOCUMENTS

| | | | |
|---|---|---|---|
| 3,141,998 | 7/1964 | Silkman | 361/382 |
| 3,766,439 | 10/1973 | Isaacson | 317/100 |
| 4,007,781 | 2/1977 | Masters | 165/46 |
| 4,447,842 | 5/1984 | Berg | 361/386 |
| 4,468,717 | 8/1984 | Mathias et al. | 361/382 |
| 4,517,624 | 5/1985 | Wessely | 361/387 |
| 4,583,583 | 4/1986 | Wittel | 165/46 |
| 4,589,057 | 5/1986 | Short | 361/386 |
| 4,631,573 | 12/1986 | Sutrina | 357/82 |

FOREIGN PATENT DOCUMENTS

| | | |
|---|---|---|
| 152152 | 9/1982 | Japan . |
| 44754 | 3/1983 | Japan . |
| 220954 | 11/1985 | Japan . |
| 790383 | 12/1980 | U.S.S.R. . |

OTHER PUBLICATIONS

Porter, R., Controlling Temperatures in Phased Array Antennas, IEEE Mech. E. Conference, Arlington, Va, 11/77.

W. B. Archey, "Water Cooling Plate for Card-on--Board Packages", IBM Tech. Disclosure Bul., vol. 19, No. 2 (1976).

*Primary Examiner*—Rolf Hille
*Assistant Examiner*—Doris J. Johnson
*Attorney, Agent, or Firm*—W. G. Sutcliff

[57] ABSTRACT

The invention is a cooling apparatus for electronically steered phased array antennas in radar systems. The apparatus includes a rigid tube, used in multiplicity with a series of identical apparatus, located adjacent to the transmitter/receiver modules in the antenna and having a plurality of longitudinal slots. Flexible hoses are inserted into the tubes so that when a liquid coolant is introduced under pressure into the hoses, the fluid pressure will be sufficient to cause expansion of the flexible hose material enough so the material expands outward through the slots in the tubes and becomes flush against the side of the transmitter/receiver modules, thereby maximizing heat transfer between the modules and the liquid coolant.

10 Claims, 5 Drawing Sheets

FLEXIBLE DIAPHRAGM COOLING DEVICE FOR MICROWAVE ANTENNAS

BACKGROUND OF THE INVENTION

One of the most widely used microwave antennas for radar is the parabolic reflector, which is a device that radiates and focuses electromagnetic energy by use of the shape of the curve of a parabola. The typical design of a radar system with a parabolic reflector involves an individual radiator that transmits electromagnetic energy toward the reflector where it is then directed toward a target. Reflected energy from the target returns to the parabolic reflector where it is focused onto an individual receiver. Data processing equipment then interprets the signal. The design of this radar system is such that the transmitter, receiver, data processing equipment, and the parabolic reflector are all individual and distinct elements of the radar unit. As a by-product of radar operation, each element is heated. Because in the parabolic reflector radar system design the elements are sufficiently separated, cooling, especially of the transmitter, may be accomplished fairly easily.

While this radar design is effective, the time and mechanical stress of physically orienting the parabolic dish for direction is a disadvantage. Furthermore, mechanical scanning is required and typical scan rates are in the range of 60–120 azimuth degrees per second. For detection of a small number of objects the parabolic dish antenna is adequate but in order to track a large number of objects a different type of antenna is required.

An electronically steered phased array radar utilizes an antenna that consists of a large number of fixed individual radiators suitably spaced over a flat surface and electronically fed so that a beam is projected in a desired location. The beam can be made to scan by changing the relative phases of the signal and each transmitter. Although the electronically steered phased array radar system is complex, and not capable of the same precision as the parabolic dish, beam steering is essentially inertialess and this type of antenna is ideal when it is necessary to shift the beam rapidly from one position in space to another, or where it is required to obtain information about many targets at a flexible, rapid data rate.

Unlike the parabolic dish antenna, with an electronically steered phased array system the antenna elements, the transmitters, the receivers, and the data processing portions of the radar are often designed as a unit. Also unlike the parabolic dish antenna, heat accumulation caused by the concentration of these elements into one unit becomes a problem and adequate heat dissipation is imperative for proper radar performance.

As mentioned in an array antenna radar system, the antenna elements, transmitter, receiver, and data processing electronics typically are contained in a single unit, which will be referred to as a T/R (transmitter/-receiver) module. On the face of each module is an individual antenna used to transmit and receive signals. FIG. 1A shows individual antennae 10 with their respective T/R modules 12 on a portion of an array antenna, which may consist of anywhere from several to thousands of T/R modules 12 with the maximum number limited only by practical considerations. Note this view is from the back of the antenna and the front radiating face side is generally planar, as shown in FIG. 1B. Furthermore the individual antenna 10 are cylindrical nubs at the end of a T/R module 12 and the nubs are frictionally inserted into holes of smaller diameter on the locating plate 14 until flush with the locating plate 14. Some applications require up to 2,000 T/R modules 12 per array. These T/R modules 12 are typically small and closely spaced and usually located in a grid with equal spacing between modules.

During operation these modules generate relatively large amounts of heat, and consequently cooling becomes a critical factor. Note that the overheating of components is the primary cause of failure for radar systems. Present phased array designs utilize a very accurate front face locating plate 14 which maintains the module centers within 0.002 inches of each other at any location. The method of cooling must in no way interfere with the location accuracy of the modules on the plate. With past developments in the field of electronics, the T/R module sizes have been decreasing but the power requirements have not and consequently it is now possible to construct a radar system having a greater concentration of T/R modules. One result of the increased concentration of modules on an antenna and the greater heat accumulation within each T/R module is an increased heat buildup within the modules. An effective cooling method that addresses this increased heat accumulation within each module is very important to insure proper radar performance. The current cooling methods, although adequate for earlier antenna designs, may not be effective for cooling the more closely spaced smaller T/R modules.

One method of cooling, shown in FIG. 2, is utilized for a transmitter element 20 found in the electronically steered antenna. This method utilizes an element 20 configured with a tapered bottom compatible with similarly tapered receiving holes in a mating plate 22 such that conduction from the element 20 to the plate 22 would be sufficient to cool the element. This design is limited to phased array antenna transmitter elements generating a relatively small amount of heat.

Active phased array antennas, on the other hand, generate significantly larger amounts of heat. For maximum heat transfer from T/R modules on a phased array antenna of this type there must be high thermal conductivity between the T/R modules and a heat sink. Ideally a coolant fluid should be directly against the module but since the modules are not designed to be water-tight, this option is not possible. In lieu of direct contact, any means of transporting coolant fluid past a plurality of modules, such as through a conduit, may be used but must not impart any weight load onto the modules that would be sufficient to displace the precise alignment of the modules. Any conduit must be relatively stiff so that it could be structurally supported from the frame used to support the modules. On the other hand the conduit must adequately contact the module to encourage heat transfer. A relatively stiff conduit, if put in contact against a module, absent the introduction of some sort of intermediate conductor such as grease, must be precisely fitted or pressed against the module with an excessive force sufficient to deform the conduit around the module so that adequate surface contact exists. In all probability this deformation force of the stiff conduit would displace the module enough to result in misalignment of the module.

FIG. 3 shows a more effective heat transfer configuration where a semicircular slot 30 is designed on opposite faces of a T/R module 32 such that two adjacent modules would form a circular channel into which a heat pipe 34 is inserted for a passage means of heat dissipation. The heat pipe 34 is then used to transfer heat into a nearby heat sink. This method is cumbersome because it requires the application of grease between the heat pipes 34 and their contact surface with the T/R modules 32. Proper heat conduction depends on the distribution of the grease across the module interface. Furthermore, the custom-made heat pipes 34 are difficult to manufacture and vary in their thermal performance as a function of attitude, which is related to gravitational orientation.

Another cooling method is shown in Japanese Patent No. 0220954 dated May 11, 1985 entitled "Cooling Device For Integrated Circuit Element". This teaches improved cooling efficiency of integrated circuits using elastic cooling pipes which are bonded to a heat dissipating plate mounted on the IC substrate. The pressure of the cooling fluid causes the elastic pipes to expand and contact the upper surface of the IC chip. With the elastic pipe firmly against the IC chip, conduction from the IC chip to the cooling fluid is maximized. While this cooling technique is very effective, the arrangement of a cooling pipe mounted to a surface that is an integral part of the IC element present coupling problems when a series of IC modules exist. Furthermore, this method would not be effective if the elastic pipes required any structural support other than provided by the IC chip.

Another prior art design teaches an apparatus for cooling T/R modules by forcing a liquid coolant under pressure through a flat narrow conduit formed with two rectangular-shaped thin wall metal sheets sealed at their edges against two spacers and pressurized through the open ends. This conduit is placed between adjacent rows of T/R modules such that fluid pressure causes the metal sheets to deflect and contact the T/R modules, thereby cooling the T/R modules. This apparatus, because the metal may deform only until the metal sheet is taut, must be precisely fabricated to maximize contact with the modules. Even with precise fabrication, the heat transfer capability of the apparatus may be greatly reduced if the location of the T/R modules is slightly offset from the metal sheet, since the metal sheet will not stretch to meet the module. Overall, the effectiveness of this apparatus is highly dependent on the precise placement of the apparatus adjacent to the T/R modules.

An object of this invention is to provide a device for dissipating the heat generated from phased array antenna modules.

Another object of this invention is to provide sufficient contact between the coolant tube and the module without forcing the tube against the module causing deformation of the tube wall and unacceptable displacement of the module. The cooling device must be self-supporting and in no way interfere with the module location or with the module installation.

A further object of this invention is to provide a cooling device that is not absolutely dependent on the precise T/R module location so that the cooling device may be installed using large tolerances.

SUMMARY OF THE INVENTION

The invention is a cooling apparatus for electronically steered phased array antennas in radar systems. The apparatus includes a rigid tube, used in multiplicity with a series of identical apparatus, located adjacent to the transmitter/receiver modules in the antenna and having a plurality of longitudinal slots. Flexible hoses are inserted into the tubes so that when a liquid coolant is introduced under pressure into the hoses, the fluid pressure will be sufficient to cause the flexible hose material to expand outward through the slots in the tubes and become flush against the side of the transmitter/receiver modules, thereby maximizing heat transfer between the modules and the liquid coolant.

BRIEF DESCRIPTION OF THE DRAWINGS

The above as well as other features and advantages of this invention will become apparent through consideration of the detailed description in connection with the accompanying drawings in which.

EMBODIMENT OF THE INVENTION

FIG. 4 shows four stages for the assembly of the cooling device in this invention and also illustrates the theory of operation.

Figure 4A:
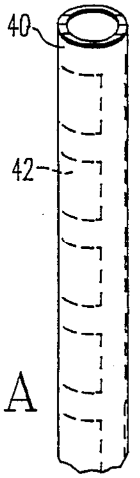
FIGS. 4A, 4B, 4C and 4D show the assemblage of one embodiment of the invention.
Figure 4B:
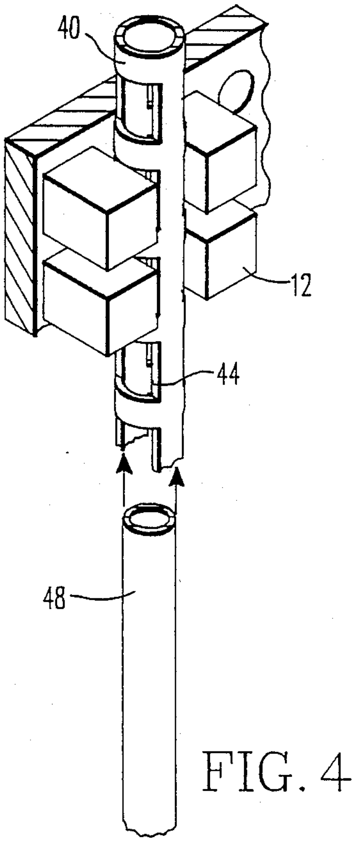

Starting with a small diameter thin wall tube 40 shown in FIG. 4A (approximately ½ inches diameter, 0.010 inch thickness), pairs of opposed longitudinal sections 42 are cut and removed such that a skeleton of the tube 40, shown in FIG. 4B, exists with openings 44 approximately the length of a T/R module 12. Experience has indicated that aluminum is a suitable material for the tube, although other materials acceptable for thin tubing may be used. Note that T/R module 12 will be used hereafter to represent T/R modules in general and that any similarly shaped T/R module could be substituted. A means for expandably containing a liquid coolant, such as a thin wall flexible hose 48, is used inside the tube 40. The flexible hose 48, which may be of the same length as the tube 40, will be inserted in the tube 40. The hose must have a small enough diameter, such as 7/16", to fit into the tube 40 and must be of a material and thickness to permit adequate heat transfer through the hose wall. Furthermore, the hose 48 must expand relatively easily. Acceptable material for this would include rubber or an expandable elastomer having a dispersion of metal particles throughout for high heat conductivity. A typical wall thickness could be 0.015". Note the number, location, and configuration of the openings 44 may be adjusted to accommodate different shaped modules at different locations. In this embodiment, after the longitudinal sections 42 are removed, the exposed edges may be sharp or uneven and therefore should be smoothed using such techniques as chemical etching or mechanical sanding. Furthermore the expandable material may be made more durable with the introduction of expandable cloth or expandable cord to reinforce the material.

Figure 4C:
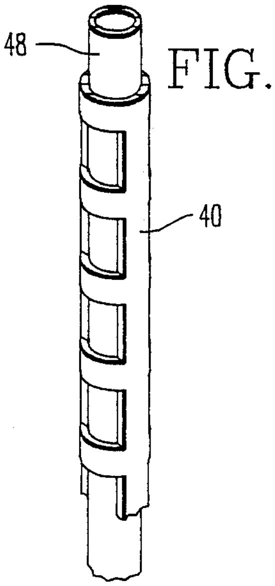

In FIG. 4C the hose 48 is fully inserted into the tube 40 so that the hose 48 is completely captured by the tube 40. The hose 48 is then physically attached to the tube 40 through such means as adhesion or bonding through vulcanization.

Figure 4D:
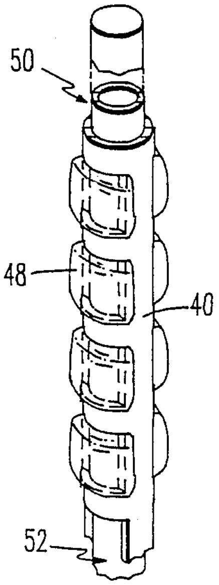

In FIG. 4D one end 50 of the hose 48 is sealed and coolant fluid, such as that known as Coolanol C25R, which is a trademark owned by the Monsanto Company for an organosilicate ester, under pressure is applied to the other end 52. The result is the expansion of the hose 48 and localized bulging where the hose 48 is unsupported by the tube 40. Note the sealed end 50, for greater heat transfer, would not be sealed but connected to an overall cooling system under pressure and fluid under pressure would pass through the hose 48. The encasement of the expandable hose by the relatively stiff tube does not in any way enhance the heat transfer properties of the hose but does provide the necessary structural support to the hose so that the weight of the hose is not supported by the modules and the direction of the hose may be controlled.

Figure 5:
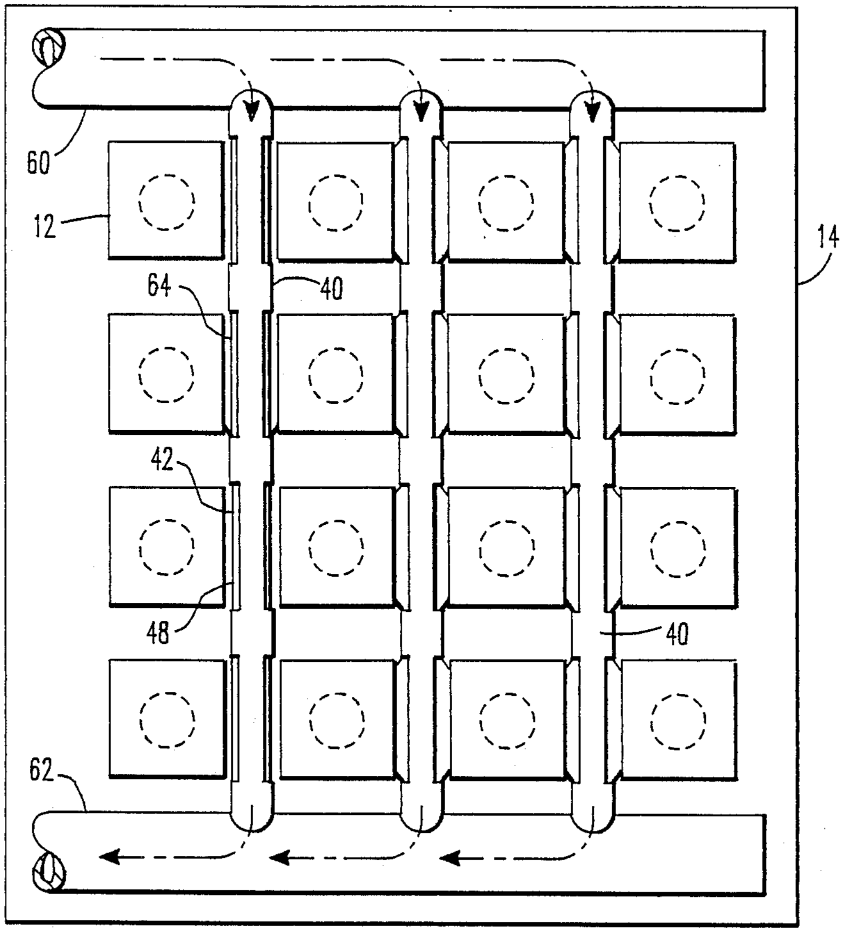
FIG. 5 shows the invention in position ready to cool the T/R modules on a phased array antenna.

FIG. 5 shows an illustration of the cooling device as it would actually operate. T/R modules 12 are supportably mounted on a plate 14 in a grid-like pattern and the cooling apparatus, also supported by the plate 14, utilizes the cooling tubes 40 to cool the modules 12. While in this embodiment the cooling fluid enters through a supply line 60 and after traveling through the cooling tubes 40 exits through the outlet 62, such that the flow through all of the tubes 40 is in the same direction, the design may be modified so that a counterflow arrangement exists whereby the coolant flow in adjacent tubes 40 would be in opposite directions. This technique may provide more temperature uniformity for a given module. A plurality of tubes 40 is connected in parallel between the supply line 60 and the outlet line 62. The tubes 40 are located as close as possible to the modules 12 but are not touching modules 12. Furthermore, the location of the longitudinal slots 42 on the tube 40 are approximately adjacent to the modules 12 such that the exposed expandable material contacts the sides of the modules 12.

The hose 48 in the tube 40 at location 64 in FIG. 5 is purposefully shown without any fluid flow or internal pressure applied. Note the fit between the modules 12. The tube 40 does not contact the module 12, although slight contact would be permissible and harmless as long as sufficient force is not generated by the contact to displace the precise locations of the modules 12.

While a primary goal in the design of this device is to minimize the lateral forces on the modules 12 caused by contact with the cooling tubes 40, even this invention exerts some force. Typical operating pressures for the coolant are approximately 60 psi and the surface area on the side of a typical module 12 is about 1 square inch. For this reason the expandable material that contacts the module 12 still exerts a force of about 60 pounds on the module 12. Except for the rows of modules at the edges of the array, which must be structurally reinforced, the presence of a hose 48 on both sides of any module acts to balance the force so that each module 12 actually is subjected to a balanced compression force of about 60 pounds. This is considered acceptable. Furthermore, since the fluid pressure is uniform throughout the grid and the module surface areas are equal whatever force exists will be approximately uniform across the grid.

Figure 1B:
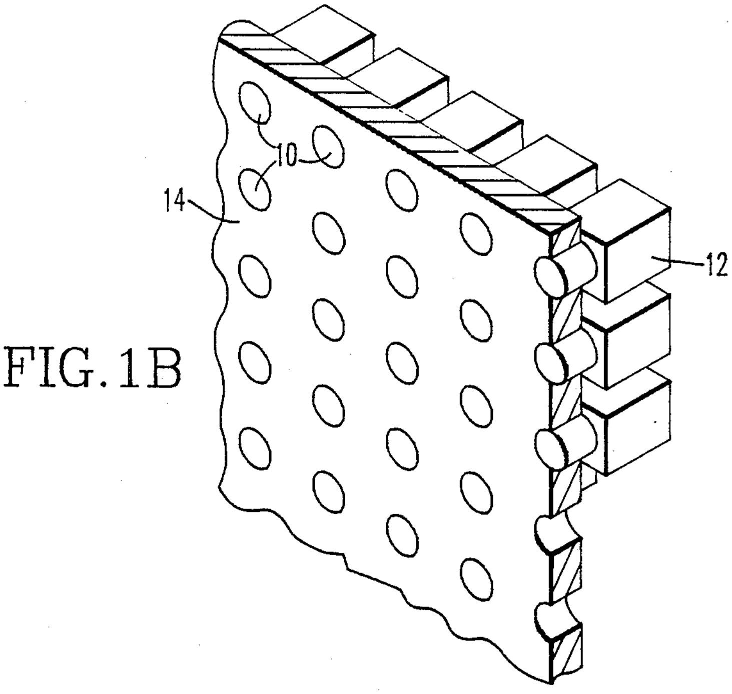
FIGS. 1A and 1B are views of a portion of phased array antenna showing a representative number of T/R modules and their relative position to one another on a structural plate.
Figure 1A:
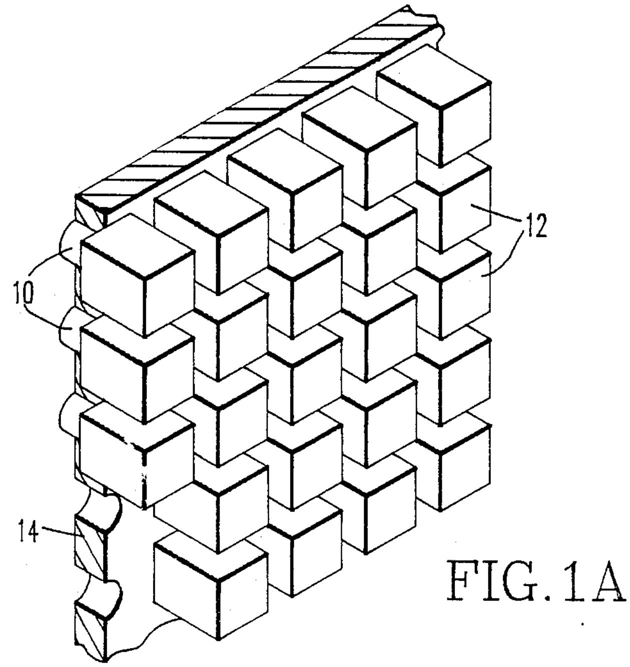
Figure 2:
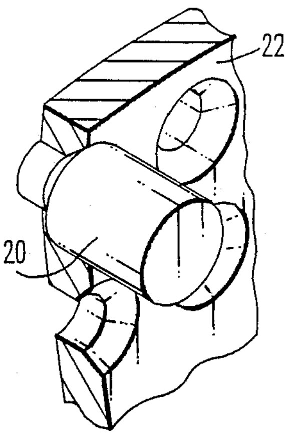
FIG. 2 is a simplified sketch of a transmitter module mounted to a plate used for a passive electronic phased array antenna.
Figure 3:
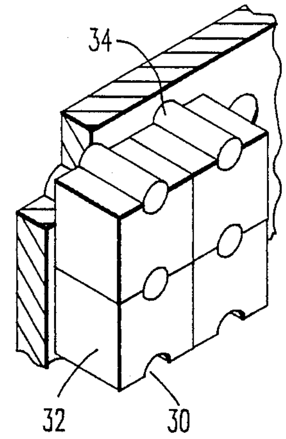
FIG. 3 illustrates a prior art system which utilizes heat pipes to remove heat from the T/R modules on a phased array antenna.
Figure 6:
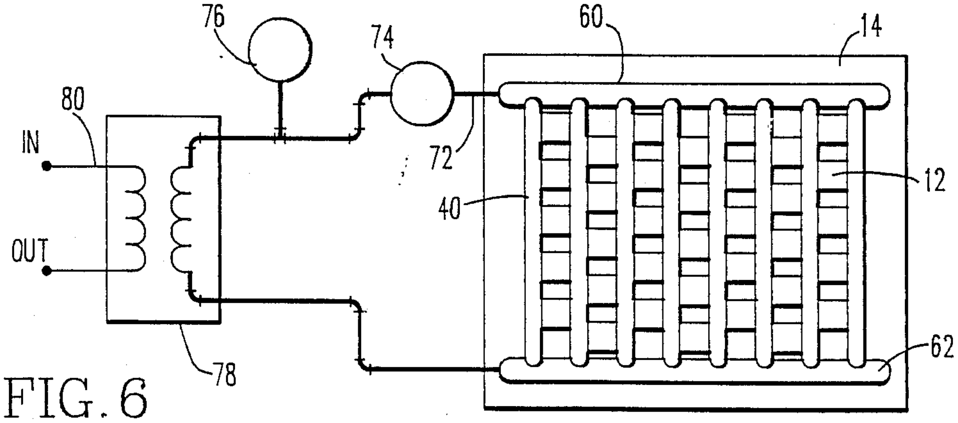
FIG. 6 is an illustration of one overall system utilizing the invention to cool T/R modules on a phased array antenna.

FIG. 6 illustrates a system incorporating the cooling device to cool a phased array antenna. Note the T/R modules 12 located on the antenna between the cooling tubes 40. Unlike FIG. 5, one column of modules 12 is vertically offset relative to an adjacent column of modules. While the configurations in FIG. 5 and FIG. 6 are functionally equivalent, the design of the coolant tubes 40 in FIG. 6 must be modified such that the openings in the tubes are adjacent to the module locations. Generally, the openings in the coolant tubes 40 may be located anywhere along the tubes to accommodate the positions of the modules 12 on the antenna. The coolant fluid is contained in a closed loop 72 and circulated through the loop 72 using a pump 74. To guarantee the pump will always have a fluid supply, an accumulator 76 contains a reservoir of fluid. The fluid enters the inlet manifold 60, is distributed through the series of coolant tubes 40 with their associated hoses (not shown), transfers heat from the T/R modules, enters the outlet manifold 62 and is pumped through a heat exchanger 78 where the fluid is cooled before again starting though the loop 72. A locating plate 14 is independently supported and the entire array of tubes 40, the inlet manifold 60, and the outlet manifold 62 are rigidly mounted directly to the plate 14 so that the plate 14 carries the entire weight and consequently no weight of the tubes or manifolds rests on the modules. The modules are also supported by the plate 14, similar to the arrangement in FIG. 1. Furthermore, the rigid support provided through the plate 14 prevents not only the deadweight load from resting on the modules but furthermore prevents the modules from experiencing any lateral force that may be caused by lateral accelerations of the manifolds and tubes. The only force the modules will be subjected to will be that caused by the contact of either the expandable material or the flexible material under pressure pressing against the sides of each module. The heat exchanger 78 has a separate heat sink from which another loop of coolant 80 is used to cool the closed loop 72. Note it is entirely possible for the tubes to travel horizontally past the array of modules, rather than vertically as shown in FIG. 5.

While this discussion has addressed the embodiment of a hose inside a circular tube, a number of other embodiments are possible.

Figure 7A:
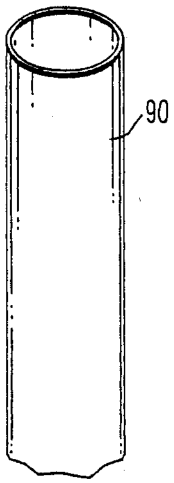
FIGS. 7, 8, 9 and 10 illustrate alternative embodiments of the invention.
Figure 7C:
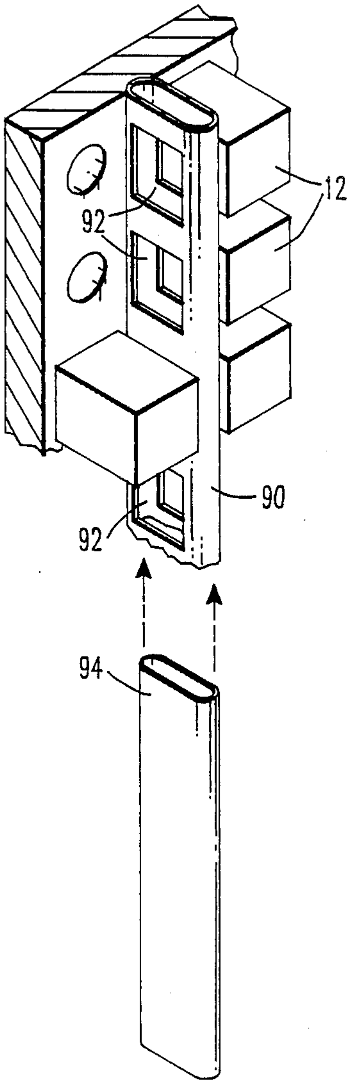
Figure 7D:
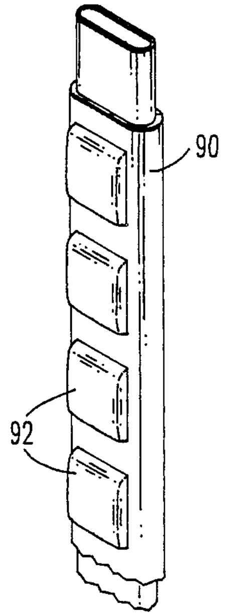
Figure 7B:
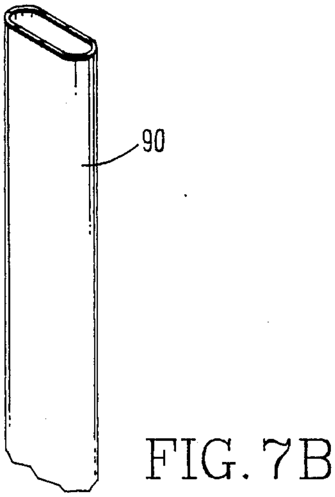

One preferred embodiment in FIG. 7A shows a circular tube 90 similar to that tube 40 shown in FIG. 4A. In order to maximize the surface area on the sides of the tube 90, the tube 90 is compressed at two opposite points such that its shape approximates that of a ellipse as shown in FIG. 7B. Just as previously done, opposed longitudinal slots 92 are removed from the tube 90 as shown in FIG. 7C. An expandable hose 94 similar to the hose 48 found in FIG. 4B is inserted into the tube 90 such that the hose 94 becomes captured. In this embodiment with the tube 90 placed between a set of modules 12, when the expandable hose 94 is filled with pressurized coolant as shown in FIG. 7D the elliptical shape of the tube 90 will permit a greater surface area of the expandable hose 94 to contact the modules. The embodiment presented in FIGS. 7A–D is preferred because of the ease with which it may be manufactured.

Figure 8:
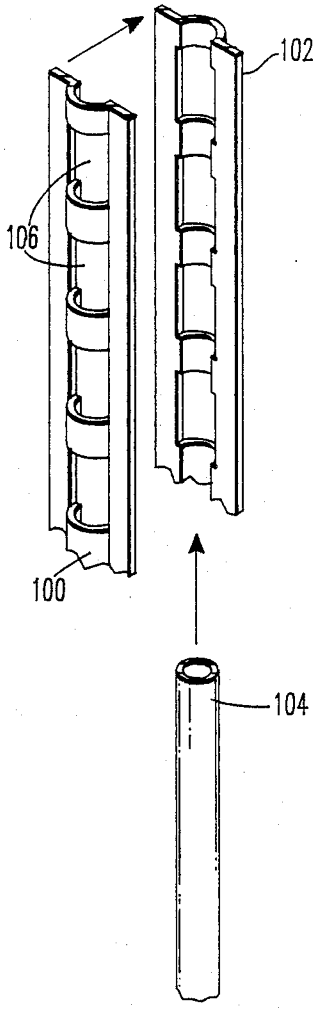

Another preferred embodiment, shown in FIG. 8, involves the mating of two preformed plates 100 and 102. Before the two plates 100 and 102 are mated, an expandable hose 104 is secured by adhesion or vulcanization to the inside of either plate 100 or 102. This process eliminates the potential difficulties that may be encountered while feeding an expandable hose through a tube as done in the previous embodiments. Note that this design does not improve the effectiveness of the cooling device but merely provides a technique by which manufacturing and assembling is made easier. The individual plates 100 and 102 not only are easier to manufacture, but furthermore working with each plate makes the removal of material for the opposed longitudinal slots 106 a simpler task. With the hose 104 in place between the two plates 100 and 102, the shoulders of the plates 100 and 102 may be secured together to totally enclose the tube 104. Just as before when the hose 104 is filled with a pressurized fluid the hose will expand and protrude through the longitudinal slots 106 to contact the modules (not shown). The embodiment presented in FIG. 8 is preferred because of the ease with which it may be manufactured.

Figure 9:
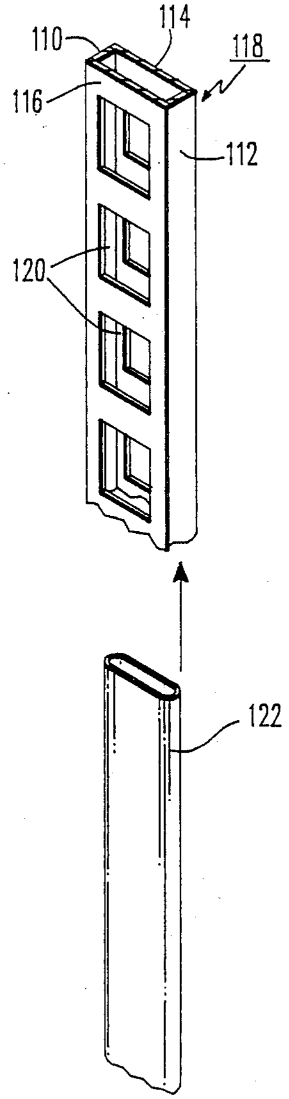

Still another embodiment is illustrated in FIG. 9. A pair of flat plates 110 and 112 having similar dimensions are attached to two other plates 114 and 116 each having larger widths than plates 110 and 112. The four plates are connected such that a rectangular conduit 118 is formed. Material is removed from plates 114 and 116 such that rectangular openings 120 are formed in the plates 114 and 116. An expandable hose 122 is placed inside of the conduit 118 such that the hose 122 is captured by the conduit 118. Pressurized fluid will cause the hose 122 to expand through the rectangular openings 120 and contact the modules (not shown). Note in this embodiment the rectangular conduit 118, rather than being comprised of four rectangular plates, could be a standard commercially produced conduit and if so only the removal of material for the openings 120 would be required. Another method for fabrication of the rectangular conduit 118 would involve forming the conduit through aluminum extrusion.

Figure 10:
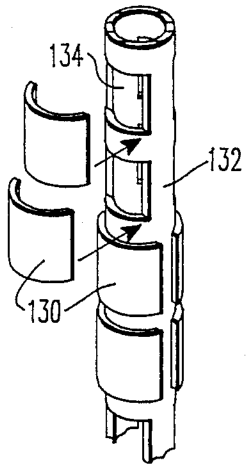

Still another embodiment of this invention is illustrated in FIG. 10. Rather than using an expandable hose shown in the previous figures, FIG. 10 shows patches of expandable material 130 that are used. The patches 130 are secured to either the outer surface or the inner surface of a tube 132 having opposed longitudinal slots 134 such that the tube 132 may be pressurized with a fluid coolant and the patches 130 will expand to contact modules 12 located adjacent to the tubes 132. Note that while a circular tube 132 is discussed in FIG. 10, this approach applies to any configuration discussed earlier.

A further embodiment would involve the substitution of a thin flexible metallic sheet, such as stainless steel with a thickness of 0.005", in the place of the expandable material patch 130 found in FIG. 10. Note that the metallic sheet will not expand and consequently the sheet must contain surplus material such that when the tube 132 is pressurized the material will bulge through the openings 134 and contact the module area.

Note that this invention may be used to heat as well as cool modules by providing a warming pressurized fluid rather than a cooling fluid.

Finally those skilled in the art may devise other embodiments and applications for the device of the invention as described above, which embodiments are well within the scope of the invention. Accordingly, it is desired that the invention not be limited by the details of the embodiments described above except as defined by the appended claims.

I claim:

1. A cooling apparatus for transmitter/receiver modules on an electronically steered phased array antenna comprised of:
   - a means for expandably or flexibly containing a coolant fluid under pressure such that expansion or flexure results in contact of the container with one or more modules to be cooled and heat transfer between the container coolant fluid and the modules and wherein said means for expandably containing the pressurized coolant fluid comprises a continuous length of expandable hose opened at both ends to the fluid pressure;
   - a means for externally supporting the expandable hose so that the expandable hose does not impart any load to the module other than that load caused by the contact from the expansion or flexure of the expandable hose, said external support means further used for guiding the expandable hose to a position adjacent to the modules so that the expandable hose expansion or flexure will result in expandable hose contact with associated modules thereby resulting in module cooling.

2. The apparatus in claim 1 wherein the means of supporting and guiding the expandable hose is comprised of a relatively rigid tube, independently supported and located adjacent to a plurality of modules, containing the hose and having sections of the tube wall removed to permit expansion of the expandable hose beyond the boundaries of the tube such that the expanded hose may contact one or more of the modules to be cooled.

3. The apparatus in claim 1 wherein the means of supporting and guiding the expandable hose is comprised of a conduit, independently supported and located adjacent to a plurality of modules, formed by the mating of a pair of preformed semi-cylindrical plates with longitudinal openings and with protruding flat surfaces for mating.

4. The apparatus in claim 1 wherein the means of supporting and guiding the expandable hose is comprised of a conduit, independently supported and located adjacent to a plurality of modules, formed with a first pair of rectangular plates having longitudinal openings and a second pair of solid rectangular plates, said first pair separated and disposed at right angles with respect to said second pair, also separated, and attached to each other to form a rectangular shaped conduit.

5. A cooling apparatus for transmitter/receiver modules on an electronically steered phased array antenna comprised of:
   - a container having a plurality of openings located adjacent to a plurality of modules;
   - a patching means to provide an approximately flush covering over the plurality of openings such that a pressurized coolant fluid may be introduced into the container and the patches will bulge by expansion or flexure beyond the boundaries of the container to contact one or more of the modules to be cooled.

6. The apparatus in claim 5 wherein the means of patching comprised of securing, by means of adhesion or vulcanization, patches of an expandable elastomer to the inner or outer wall of the container thereby covering the openings.

7. The apparatus in claim 5 wherein the means of patching is comprised of securing, by means of soldering, patches of a thin metal sheet easily capable of flexing under pressure to the inner or outer wall of the container thereby covering the openings.

8. An improved electronically steered phased array antenna comprised of:

a flat plate having a multiplicity of fixed sized circular holes arranged in a grid pattern to form an array across the face of the plate;

a multiplicity of transmitter/receiver modules each with a cylindrical nub protruding from its surface and of a slightly smaller diameter than the circular hole in the flat plate such that the module may be frictionally fitted in a hole and with the plurality of other modules form an array of modules across the face of the plate;

a cooling means to transfer heat from the transmitter/receiver modules during operation of the antenna comprised of a plurality of thin-walled expandable hoses for containing a coolant fluid under pressure such that the fluid pressure causes hose expansion, the hose positioned adjacent to a plurality of transmitter/receiver modules thereby contacting the module surface resulting in heat transfer from the modules to the coolant fluid and also a plurality of thin-walled rigid tubes, each having longitudinal slots, encasing each of the plurality of expandable hoses and positioned parallel to one another oriented such that the longitudinal slots of the tube are each adjacent to transmitter/receiver modules, thereby permitting the hoses when pressurized with coolant fluid to expand beyond the boundaries of the tubes and firmly contact the face of each module.

9. The antenna in claim 8 wherein the cooling means is further comprised of:

a pair of manifold pipes one located at each end of the plurality of tubes containing hoses and connected to each of the plurality of hoses such that a fluid flow through the hoses may be maintained with a singular fluid inlet and fluid outlet provided at the manifolds;

a series of supports secured to the plate at one end and to the tubes and manifolds at the other end to provide deadweight and lateral support to the manifold and tubes such that the transmitter/receiver modules will not in any way support the mass of the cooling system;

a heat exchanger and pump attached to the manifold outlet and manifold inlet to provide a supply of coolant fluid and to dissipate the heat transferred from the transmitter/receiver modules to the coolant fluid.

10. The antenna in claim 9 wherein the fluid flow through the hose is in a counterflow arrangement thereby permitting more temperature uniformity for a given module.

* * * * *